United States Patent [19]
Summerfelt

[11] Patent Number: 5,909,043
[45] Date of Patent: Jun. 1, 1999

[54] SACRIFICIAL OXYGEN SOURCES TO PREVENT REDUCTION OF OXYGEN CONTAINING MATERIALS

[75] Inventor: Scott R. Summerfelt, Dallas, Tex.

[73] Assignee: Texas Instruments Incorporated, Dallas, Tex.

[21] Appl. No.: 08/252,727

[22] Filed: Jun. 2, 1994

[51] Int. Cl.$^6$ .......................... H10L 27/108; H10L 29/76; H10L 29/94; H10L 31/119
[52] U.S. Cl. ............................................. 257/298
[58] Field of Search .................... 257/298, 310, 257/379; 361/205

[56] References Cited

U.S. PATENT DOCUMENTS

| | | | |
|---|---|---|---|
| 3,274,468 | 9/1966 | Rodriguez et al. | 361/205 |
| 3,798,516 | 3/1974 | Short | 361/205 |
| 4,528,546 | 7/1985 | Paoli . | |
| 4,982,309 | 1/1991 | Shepherd . | |
| 5,003,428 | 3/1991 | Shepherd . | |
| 5,053,917 | 10/1991 | Miyasaka et al. . | |

OTHER PUBLICATIONS

Fabrication and properties of epitaxial ferroelectric heterostructures with (SrRuO$_3$) isotropic metallic oxide electrodes, C. B. Eom, et al., AT&T Bell Labroratories, Murray Hill New Jersey 07974 pp. 2570–2572 *Appl. phys,* vol. 63, No. 18, Nov. 1, 1993.

RuO$_2$ Thin Films as Bottom Electrodes for High Dielectric Constant Materials, Kohta Yoshikawa, et al., *Jpn Appl. Phys,* vol. 33 (1994).

Reactive Sputtering of RaO$_2$ Films, E. Kolawa, et al. Cal. Institute of Technology, Pasadina 91125, Elsevier Sequoia/ printed in the Netherlands.

Reactively Sputtered RuO$_2$ Diffusion Barriers, E. Kolawa, et al., Cal. Institute of Technology, Pasadena, 91125, *Appl. Phys. Lett* 50, (13) Mar. 30, 1987.

Summary Abstract: Reactively Sputtered RuO$_2$ and Mo–O Diffusion Barriers, F. C. T. So, et al., Cal. Institute of Technology, Pasadena 91125, *J. Vac. Sci. Tech.* B5(6) Nov./ Dec. '87 pp. 1748–1749.

(List continued on next page.)

*Primary Examiner*—Stephen D. Meier
*Attorney, Agent, or Firm*—Richard L. Donaldson

[57] ABSTRACT

Some VLSI fabrication steps can cause degradation of the useful properties of many high dielectric constant materials that will likely be used in future high density integrated circuit devices. The presence of hydrogen, for example, can readily reduce (i.e. remove oxygen from) oxygen-containing dielectric materials. In general, there exists a critical oxygen activity value below which an oxygen-containing dielectric material will become conductive or otherwise unacceptable. Reduction of the oxygen-containing material during VLSI processing is prevented by providing a nearby sacrificial source of oxygen. Generally, the oxygen source is reduced to a lower oxidation state (i.e. the material loses oxygen) at an oxygen activity level that is larger than the critical oxygen activity value. The required placement of the oxygen source material relative to the oxygen-containing dielectric material is in general determined by the requirement that the oxygen partial pressure over the entire volume of the oxygen-containing dielectric material not fall below the critical value during subsequent VLSI processing steps. The presence of these sacrificial oxygen source materials (e.g. 56) elevates the partial pressure of oxygen in the vicinity of the oxygen-containing dielectric material (e.g. barium strontium titanate 46) such that the oxygen partial pressure during subsequent fabrication steps does not fall below the oxygen partial pressure at which the oxygen-containing dielectric material is reduced. Structures wherein the sacrificial oxygen sources are part of capacitor electrodes (e.g. RuO$_2$ 44) are presented, as well as structures wherein volumes of sacrificial oxygen source materials 56 are formed nearby to integrated circuit capacitors.

14 Claims, 5 Drawing Sheets

OTHER PUBLICATIONS

Microstructure of Reactively Sputtered Oxide Diffusion Barrieres, E. Kolawa, et al., *Journal of Electronics Materials,* vol. 17, No. 5, '88 pp. 425–431.

Microstructure of $RuO_2$ Layer as Diffusion Barrier Between AL and Si Substrate, C. W. Nieh, et al. Elsevier Science Publishers B.V. North–Holland Physics Publishing Division, pp. 177–180 *Materials and Letters,* vol. 6.

Reactively Sputtered Indium Oxide Diffusion Barrier, E. Kolawa, et al. Elsevier Sequoia/Printed in The Netherlands, *Thin Solid Films* 166 (1988) pp. 15–20.

Indium Oxide Diffusion Barriers for Al/SI Metallizations, E. Kowawa, et al. *Appl Phys. Lett* 53 (Dec. 26, '88) 2644–2646.

Thermodynamic Modeling of Equilibrium Subsolidus Phase Relations in the $Ag-Pd-O_2$ System, Sea Fue Wang, et al. *Journal of the American Ceramic Society,* vol. 74, No. 6, pp. 13491353.

Bottom Electrodes for Integrated $Pb(Zr, Ti)O_3$ Films, Philip D. Hren, et al., North Carolina State Uni. Dept. of Materials Science and Engineering, Raleigh, NC 27695.

Barrier Layers for Realization of High Capacitance Density in $SrTiO_3$ Thin–Film Capacitor on Silicon, Toshiyuki Sakuma, et al., *Appl. Phys. Lett.* 57 (23), Dec. 3, '90 pp. 2431–2433.

Barrier Mechanism of Pt/Ta and Pt/Ti Layers for $SrTiO_3$ Thin Film Capacitors on Si, Koichi Takemura, et al. Fundamental Research Laboratories, NEC Corporation, Kowasaki 216, Japan, pp. 481–488.

Base Electrodes for High Dielectric Constant Oxide Materials in Silicon Technology, A Grill, et al. *J. Mater Res.* vol. 7, No. 12, Dec. '92.

Theory of Conduction and Breakdown in Perovskite Thin Films, Rainer Waser, et al., Philips GmbH Forschungslabroratorium Aachen, D–5100 Aachen, Federal Republic of Germany.

A Stacked Capacitor with $(Ba_x Sr_{1-x}) TiO_3$ For 256M DRAM, Kuniaki Koyana, et al., VLSI Development Div. NEC Corp. 1120 Shimokuzawa, Sagamihara, 229, Japan,, pp. 32.1.1–32.1.4.

A Newly Designed Planar Stacked Capacitor Cell with High Dielectric Constant Film for 256Mbit DRAM, T. Eimori, et al., 0–7803–1450–6, 1993 IEEE, ULSI Laboratory, Semiconductor Research Lab. Mitsubishi Electric Corp. 4–1 Mizuhara, Itami, Hyogo 664 Japan.

SACRIFICIAL OXYGEN SOURCES TO PREVENT REDUCTION OF OXYGEN CONTAINING MATERIALS

FIELD OF THE INVENTION

This invention generally relates to the fabrication of high-dielectric capacitors used, for example, in high density dynamic random access integrated circuit memories.

BACKGROUND OF THE INVENTION

Without limiting the scope of the invention, its background is described in connection with the fabrication of high density dynamic random access memory (DRAM) devices.

Heretofore, in this field, thin film capacitors in DRAMs have used $SiO_2$ or $Si_3N_4$ as the dielectric material. As the density of integrated circuits (number of devices per square centimeter) increases, the capacitors which store electrical charge in each DRAM memory device are generally required to decrease in size while maintaining approximately the same capacitance. Referring to the following equation, C is the capacitance of a planar capacitor, $\epsilon$ is the dielectric constant, $\epsilon_0$ is the dielectric permittivity of free space (a constant), A is the area, and d is the thickness of the dielectric.

$$C = \frac{\epsilon \epsilon_0 A}{d}$$

It is seen that the capacitance is directly proportional to the dielectric constant and inversely proportional to the dielectric thickness. Therefore, to build smaller capacitors while maintaining the same capacitance, one must increase $\epsilon$ and/or decrease the dielectric thickness d.

One method of allowing a decrease in the area of capacitors in DRAM cells is to make use of materials with a much higher dielectric constant than $SiO_2$ or $Si_3N_4$. The dielectric constant for both of these materials is less than ten. An important class of high dielectric constant materials is the perovskites (e.g. $BaTiO_3$, $SrTiO_3$, and $(Ba,Sr)TiO_3$). The dielectric constants of these materials may be as high as 10,000 when they are fabricated as bulk ceramics. Other classes of materials with high dielectric constants are also being considered for use as the dielectric material in DRAM capacitors. To be useful in the manufacture of VLSI capacitors, these materials should be tolerant to the many VLSI processing steps which are used in the fabrication of DRAM cells.

SUMMARY OF THE INVENTION

It has been discovered that many VLSI process steps can cause degradation of the useful properties of many high dielectric constant materials that will likely be used in future high density integrated circuit devices.

The fabrication of capacitors utilizing high dielectric constant (hereinafter referred to as HDC) materials as their dielectrics usually involve a relatively high temperature deposition step. For example, the fabrication of a barium strontium titanate (BST) capacitor might include deposition of the BST at approximately 600° C. This temperature is higher than any previously deposited aluminum structures can withstand; therefore aluminum metallization will necessarily follow the deposition of the HDC material. Other well known VLSI fabrication steps, such as the chemical vapor deposition (CVD) of titanium, silicon nitride and tungsten, for example, all require the presence of hydrogen. The passivation of electronic traps located in the gates of MOS devices usually involves a hydrogen anneal at elevated temperatures. In addition, forming gas (largely hydrogen) is used in many anneal steps to prevent the oxidation of aluminum. All of these processes involve the presence of hydrogen at elevated temperatures and frequently occur near the end of the fabrication process. The high dielectric material will very likely already be present within the device structure when these steps are performed.

Unfortunately, the presence of hydrogen can readily reduce (i.e. remove oxygen from) oxygen containing compounds. Therefore, many fabrication steps necessary for the manufacture of DRAMs and other structures will generally reduce high dielectric constant materials which contain oxygen, thereby degrading or nullifying their advantageous electronic properties.

Figure 1:
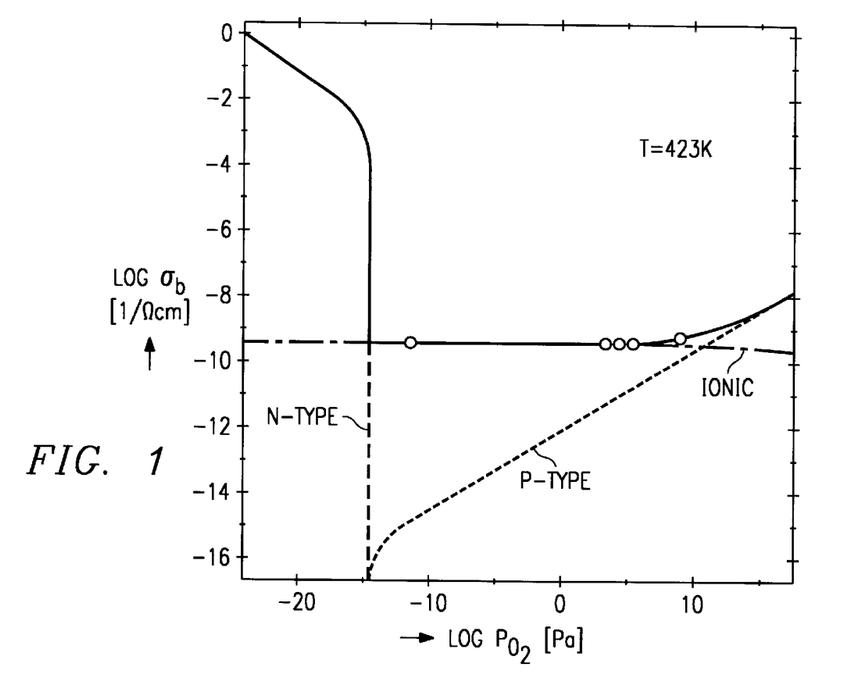
FIG. 1 is a graph of the electrical conductivity of Strontium Titanate versus partial pressure of oxygen during annealing.

The electrical properties of many high dielectric constant materials, including all of the perovskites, depend critically on their oxygen content. The partial pressure of oxygen, which may also be referred to as the oxygen activity and is hereinafter abbreviated $P(O_2)$, critically affects the electronic properties of most oxygen containing high dielectric constant materials. FIG. 1 shows the calculated conductivity (indicated by the solid line) and experimentally measured conductivity (indicated by circular symbols) of bulk acceptor-doped $SrTiO_3$ (strontium titanate, or ST) annealed at 700° C. versus oxygen partial pressure. Measurements of conductivity were made at 150° C. The figure shows that the conductivity of ST is n-type at low oxygen partial pressures, p-type at large oxygen partial pressures, and ionic (i.e. oxygen vacancies) for a range of intermediate oxygen partial pressures. In particular, the conductivity rapidly increases when the oxygen partial pressure is reduced below approximately $10^{-15}$ Pa (or equivalently $10^{-20}$ atm), where the conductivity changes from Ionic to n-type. Since the point defect chemistry of BST is similar to ST, reducing thin film BST such that it becomes n-type would be expected to similarly degrade its resistivity.

Figure 2:
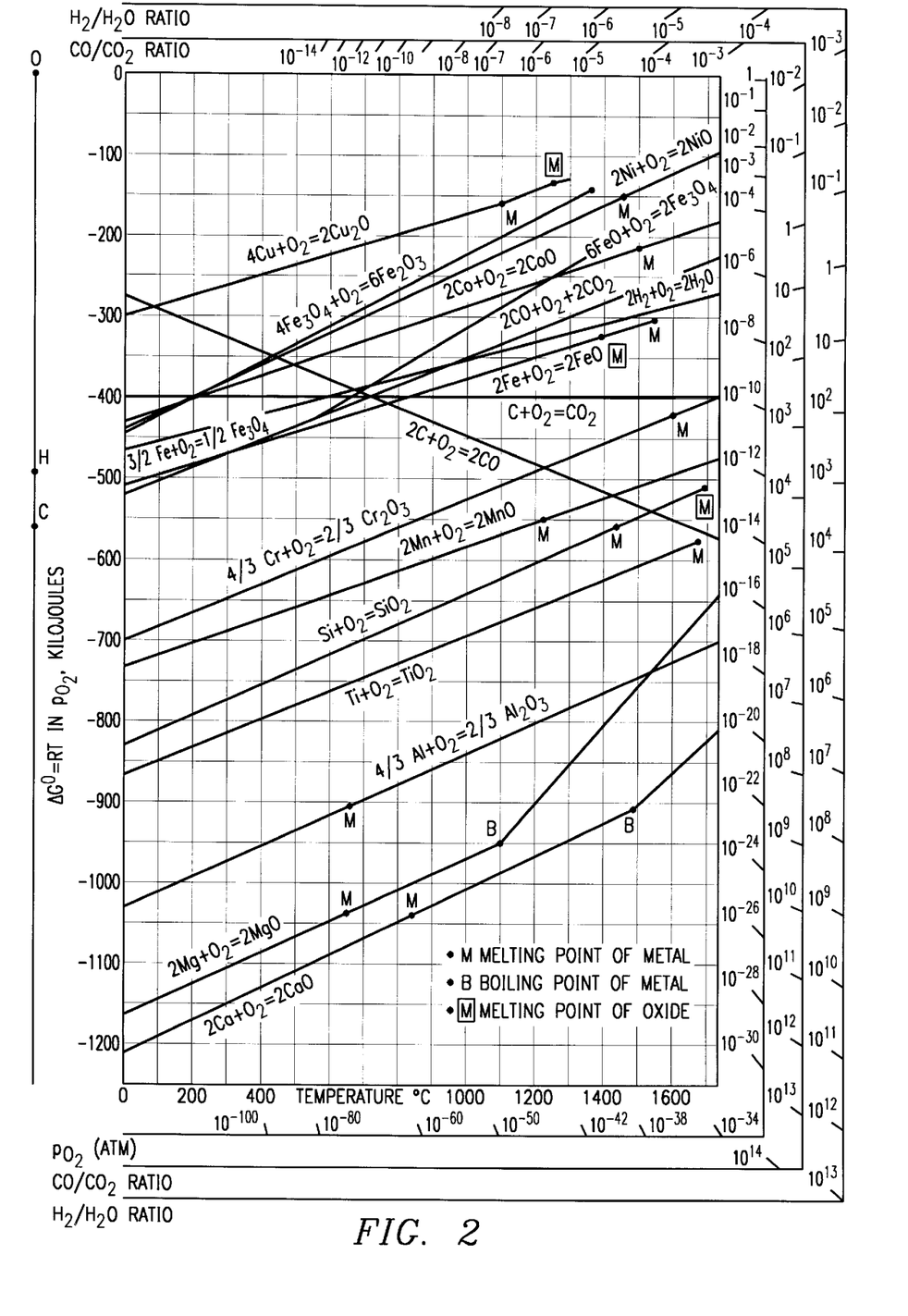
FIG. 2 is an Ellingham diagram.

FIG. 2 is an Ellingham diagram which illustrates how $H_2$ can reduce BST. The reaction of $H_2$ with $O_2$ to form $H_2O$ (where the $H_2/H_2O$ ratio is 1) results in an equivalent oxygen partial pressure of approximately $10^{-21}$, $10^{-24}$, and $10^{-28}$ atm $P(O_2)$ (partial pressure of oxygen) at 700° C., 600° C. and 500° C. respectively. As shown in FIG. 1, $10^{-21}$ atm $P(O_2)$ at 700° C. will result in n-type ST with very poor leakage properties.

The reduction of an oxygen containing material requires the removal of oxygen. The diffusion of $H_2$ is very rapid, so the rate limiting step of the reduction process when hydrogen is the reducing species will be the diffusion of oxygen (in the form of $H_2O$). It is instructive to consider whether one could affect the kinetics of the reduction process by physically preventing or slowing this oxygen diffusion. Consider a BST capacitor surrounded by a $SiO_2$ dielectric undergoing a process which uses a hydrogen anneal. The kinetics of wet oxidation are very similar to the kinetics of BST reduction since the rate limiting step is the diffusion of oxygen through the $SiO_2$. For example, an additional 2.5 nm of $SiO_2$ will grow on a 1 µm $SiO_2$ film in a steam ambient at 550° C. in 0.5 hours. Equivalently, annealing BST covered by 1 µm of $SiO_2$ in $H_2$ at 550° C. for 0.5 hour can remove enough oxygen to oxidize 0.75 nm of $SiO_2$. This degree of reduction will easily increase the BST conductivity beyond a level where it is a useful dielectric. It is known, for example, that removing only 0.02% of the oxygen from BST will drastically increase its conductivity. These figures strongly suggest that attempts to control the kinetics of oxygen removal from an oxide material through the use of diffusion barriers will not be sufficient to prevent the degradation of useful electrical properties which depend critically on oxygen content.

In general, there will exist an oxygen activity value below which the oxygen containing HDC material will become conductive or otherwise unacceptable. This 'critical' activity will be defined as $P_C(O_2)$. $P_C(O_2)$ is In general different for each material and is a function of temperature. Reduction of the oxide material can generally be prevented by providing a source of oxygen near the HDC oxide material. Generally, the oxygen source should be reduced to a lower oxidation state (i.e. lose oxygen) at an oxygen activity level that is larger than $P_C(O_2)$. The oxygen activity level at which the oxygen source is reduced will be defined as $P_R(O_2)$. Accordingly, materials suitable to act as a sacrificial oxygen source may be determined by the general requirement that $P_R(O_2) > P_C(O_2)$. In addition, the placement of the oxygen source material relative to the oxygen-containing dielectric material is in general governed by the requirement that the oxygen partial pressure $P(O_2)$ over the entire volume of the oxygen-containing dielectric material not fall below $P_C(O_2)$ during subsequent VLSI processing steps.

Generally, and in one form of the invention, the reduction of oxygen-containing materials due to VLSI fabrication steps is prevented by the presence of sacrificial oxygen sources in and/or nearby the structures which incorporate oxygen-containing materials. The presence of these sacrificial oxygen source materials elevates the partial pressure of oxygen (equivalently, the oxygen activity) in the vicinity of the oxygen-containing material such that the oxygen partial pressure during subsequent fabrication steps does not fall below the oxygen partial pressure at which the oxygen-containing material is reduced. That is, the sacrificial oxygen source(s) serve to maintain $P(O_2)$ above $P_C(O_2)$ for the entire volume of oxygen-containing material.

The preferred embodiments of the invention, described below, are apparently the first structures which prevent the reduction of oxygen-containing materials within an integrated circuit workpiece by providing sacrificial sources of oxygen. An advantage of the invention is the prevention of reduction of oxygen containing dielectric materials during VLSI processing. The use of sacrificial oxygen sources as described herein will make high dielectric materials whose properties depend critically on their oxygen content compatible with conventional VLSI fabrication technology and processes. Further increases in integrated circuit density are thereby made possible by the invention.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

Corresponding numerals and symbols in the different figures refer to corresponding parts unless otherwise indicated.

DETAILED DESCRIPTION OF THE PREFERRED EMBODIMENTS

EXAMPLES OF OXYGEN SOURCE MATERIALS

The following examples demonstrate how candidate oxygen source materials may be evaluated with respect to an oxygen containing HDC material.

As an example, the Ta in a Pt/Ta lower electrode transforms during barium strontium titanate (BST) deposition to $TaO_x$. $TaO_x$ has a large free energy of formation, and reduction requires less than approximately $10^{-34}$ atm $P(O_2)$ at 700° C. to reduce it to Ta metal. BST will suffer reduction at approximately $10^{-20}$ atm $P(O_2)$. Because in this case the oxygen activity at which $TaO_x$ is reduced is less than the oxygen activity at which BST is reduced (i.e. $P_R(O_2) < P_C(O_2)$), $TaO_x$ probably does not provide a suitable source of oxygen.

$RuO_2$ has also been investigated as a possible electrode for HDC materials such as BST. Ru has a relatively small free energy of formation, and reduction of $RuO_2$ requires only $10^{-8}$ atm $P(O_2)$ at 700° C. to reduce it to Ru metal (i.e. $P_R(O_2) \leq 10^{-8}$ atm). Therefore, a $RuO_2$ electrode will act as a oxygen source during a $H_2$ anneal and will prevent acceptor doped BST ($P_C(O_2) \leq 10^{-20}$ atm) from being reduced. Of course, a sufficient volume of $RuO_2$ must be provided so that it is not all reduced before all reducing processes are completed.

Because it is electrically conductive, $RuO_2$ may be used as the electrode itself, or it may be mixed with other electrode materials, or it may be a component of an electrode alloy. Volumes of $RuO_2$ could also be formed near but not in contact with the electrodes, if desired. Alternately, $RuO_2$ could encapsulate the capacitor structure, In which case it would act as both an oxygen source and a diffusion barrier between the electrodes and the rest of the integrated circuit.

Consideration must be given to any doping of the dielectric material. Generally, an element or ion is a donor dopant if (1) it replaces an atom in the crystal lattice and has a greater number of valence electrons than the atom it replaces or (2) it exists interstitially and its outer electron shell is less than half full. Intermediate cases are uncertain and may be determined empirically. For example, some elements behave as donor dopants in (1) when their valence is the same as the atom replaced. Likewise, in (2) some elements behave as donor dopants when their valence shell is exactly half full.

Generally, an element or ion is an acceptor dopant if (1) it replaces an atom in the crystal lattice and has a lesser number of valence electrons than the atom it replaces or (2) it exists interstitially and its outer electron shell is more than half full. Intermediate cases are uncertain and may be determined empirically. For example, some elements behave as acceptor dopants in (1) when their valence is the same as the atom replaced. Likewise, in (2) some elements behave as acceptor dopants when their valence shell is exactly half full.

While bulk acceptor doped BST becomes conductive at low oxygen partial pressures (approximately $10^{-21}$ atm at 700° C.), donor doped BST becomes conductive at much higher oxygen partial pressures. It has been estimated that bulk donor doped BST will become conductive at approximately $10^{-3}$ atm $P(O_2)$ at 700+ C. (a value which will vary with donor dopant and dopant concentration). While the $RuO_x$ electrode will prevent acceptor doped BST from being conductive, it probably won't prevent donor doped BST from becoming conductive.

Figure 3:
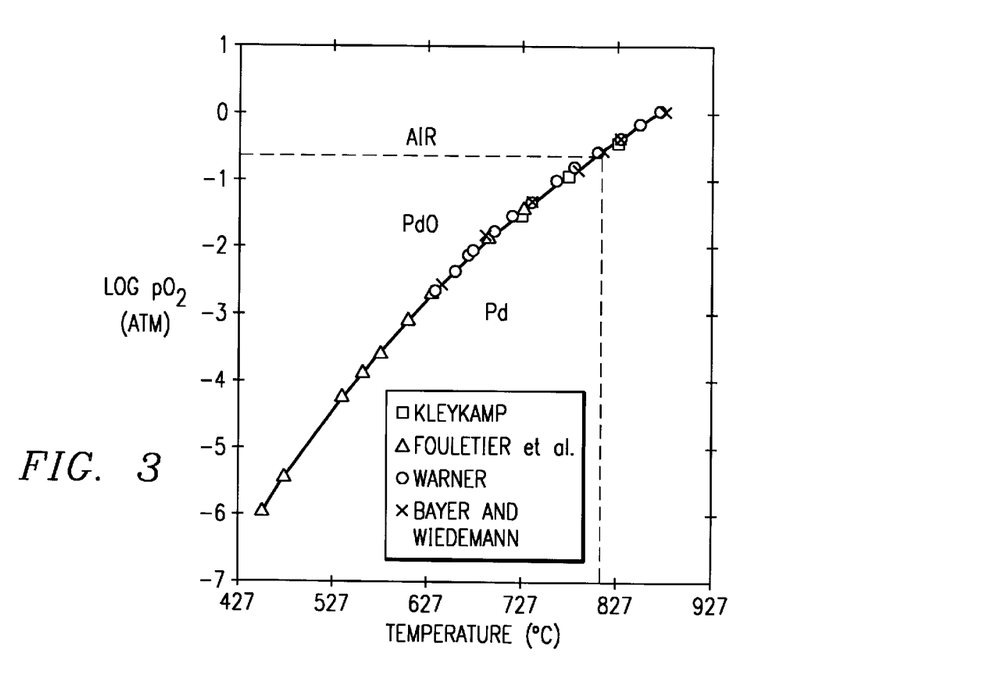
FIG. 3 is a graph of the phase stability of PdO/Pd versus temperature and oxygen partial pressure.

There are many near noble metals such as Pd which form oxides which are easily reduced. FIG. 3 shows the phase stability of PdO/Pd as a function of temperature and oxygen partial pressure $P(O_2)$. As shown in FIG. 3, $P_R(O_2)=1.6 \times 10^{-2}$ atm at 700° C. PdO can be used as an oxygen source in the electrode by alloying it with another electrode material and then oxidized during and/or after dielectric deposition to form Pt-PdO alloy. Another possibility is to deposit PdO next to the electrode.

Figure 4:
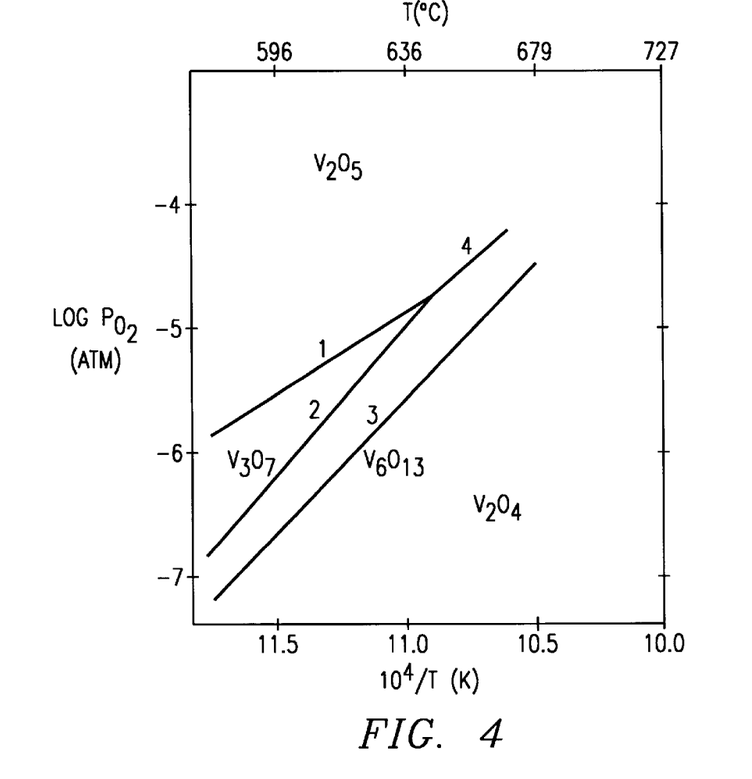
FIG. 4 is a vanadium-oxygen phase diagram.

Other types of oxygen sources are oxides that change their oxidation state. For example, FIG. 4 shows a small part of the V-O phase diagram. In the region of $P(O_2)$ and T shown, four phases of V are stable: $V_2O$, $V_3O_7$, $V_6O_{13}$ and $V_2O_4$. The average oxidation state of the vanadium changes from 5 to 4. $V_2O_5$ will act as an oxygen source when it transforms to a phase with a lower oxidation state.

NOVEL STRUCTURES

Figure 5:
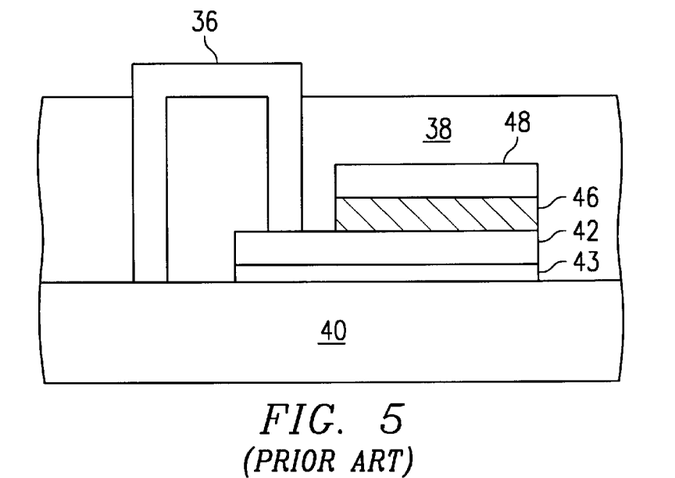
FIGS. 5–6 are microscopic cross-sections of capacitor structures which are among those that will benefit from the invention.

Capacitors may be constructed within integrated circuits in a variety of ways. The preferred embodiments of the instant invention are equally applicable to any capacitor geometry/topology. For example, FIG. 5 shows a typical structure wherein a planar capacitor is fabricated on the surface of a substrate 40. Sticking layer 43 may be deposited if needed, then the lower electrode 42, the dielectric 46 and then the upper electrode 48. The structure is then covered with a protective layer 38 (e.g. $SiO_2$). Metallization which connects one or more of the electrodes with active areas of the substrate or with other structures is provided by etching the protective layer and then depositing a conductor 36 such as polysilicon or aluminum.

Figure 6:
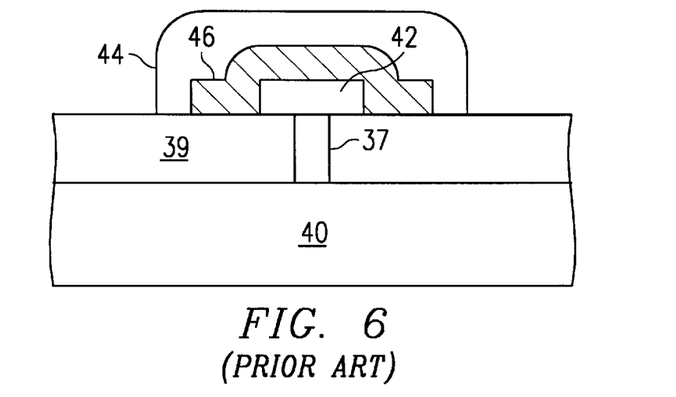

FIG. 6 shows a capacitor structure which requires less substrate surface area. Such a capacitor structure might be typical of some DRAM designs. An insulating layer 39 is deposited (e.g. $SiO_2$) and etched to allow a conductive 'plug' 37 to be deposited. A planar lower electrode 42 is deposited on the plug 37, and a layer of dielectric 46 is deposited to cover the lower electrode 42. An upper electrode 44 is then deposited to contact the dielectric 46. Metallization is then applied to provide contact to the upper electrode (not shown).

Still another capacitor structure is the well-known trench capacitor. The trench capacitor requires little substrate surface area yet has increased capacitance due to its increased dielectric surface area. Methods provided by the invention presented are equally applicable to preserving the beneficial properties of oxygen containing dielectric materials which are used in trench capacitors.

The preferred embodiments of the invention described below, as well as all of the advantages of the invention, apply to all such capacitor structures but will be illustrated with regard to a planar capacitor structure.

The preferred embodiments of the invention can be divided into those structures wherein the oxygen source material is a part of the electrical conduction path and those structures wherein the oxygen source is not a part of the conduction path. In the later embodiments, the oxygen source material need not be electrically conductive (although it may be). For all preferred embodiments, the choice of oxygen source material is governed by the requirement that $P_R(O_2) > P_C(O_2)$, as explained in the Summary of the Invention.

Figure 7:
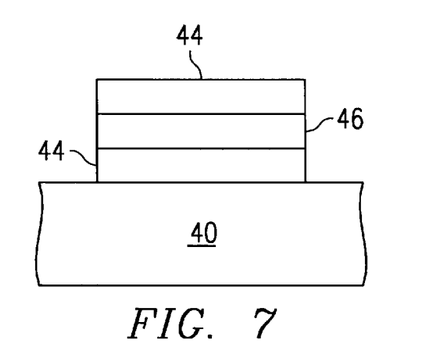
FIG. 7 is a cross section of a planar capacitor structure wherein a conductive oxygen source material is fabricated adjacent to and in electrical contact with other electrode materials.

In a first preferred embodiment, the oxygen source material forms one or both electrodes to the dielectric material. As shown in FIG. 7, reduction is best prevented by forming both upper and lower electrodes of the oxygen source material 44. If only one electrode is to be formed of the oxygen source material, then It is preferable that the upper electrode be the oxygen source so that a reducing species (e.g. hydrogen) is consumed before it reaches the dielectric 46.

Figure 8:
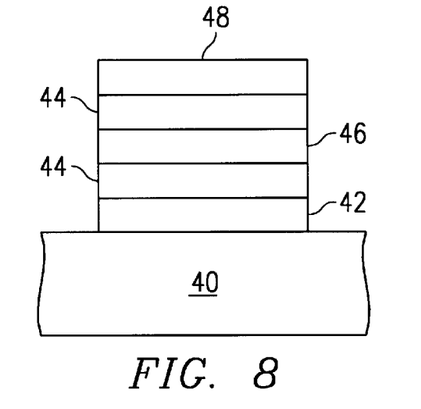
FIG. 8 is a cross section of a planar capacitor structure wherein a conductive oxygen source material is used as the capacitor electrode.

In a second preferred embodiment, the oxygen source material layer is in addition to one or more other layers which make up the electrodes. FIG. 8 shows a lower electrode 42, a layer of electrically conductive oxygen source material 44, the dielectric 46, and an upper electrode 48. The structure may also incorporate sticking layers, diffusion barriers, etc. which may be required for the specific dielectric being used within the capacitor structure. The oxygen source layers 44 may be formed in several ways. First, the oxygen source layer may be formed in a separate deposition step. Second, a mixture of materials may be deposited (e.g. sputtered) and then exposed to an oxygen ambient. Under conditions well known in the art, a portion of the deposited material will segregate and form an oxide layer on top of a layer of material which does not oxidize. This process is known as external oxidation. Of course, the resulting oxide film must be electrically conductive for this preferred embodiment. An example of a material mixture which can be externally oxidized is a mixture of platinum and palladium. The conditions under which external oxidation occurs are well known in the art for this and other metal mixtures.

Figure 9:
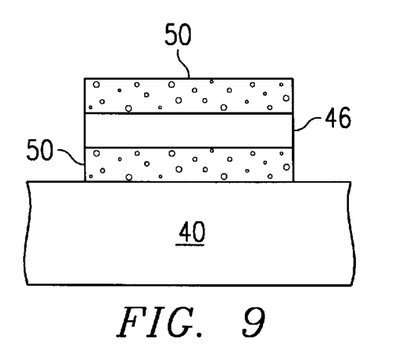
FIG. 9 is a cross section of a planar capacitor structure wherein volumes of oxygen source material exist within the capacitor electrodes.

In a third preferred embodiment, illustrated in FIG. 9, the oxygen source material may be dispersed and in the form of 'beads' within an electrically conducting layer 50 which serves as an electrode. As FIG. 9 indicates, the oxygen source material need not be electrically conductive for layer 50 to act as an electrode. The formation of such a layer may be accomplished by depositing a mixture of, for example, metals (e.g. by sputtering), and then causing oxidation in a way which causes the resulting oxygen source disperse within the body of the other metal which does not oxidize.

Such a reaction is known as internal oxidation, because the species which oxidizes is in the form of dispersed small volumes within the nonoxidized species. Alternatively, formation of the beads may be caused by reactive metal deposition in an oxygen ambient. In the preferred embodiment, the mixture is platinum and palladium which is annealed in oxygen. The conditions under which internal oxidation occurs are well known in the art for this and other metal mixtures. For example, sputter deposition of platinum (25%) and palladium (75%) alloy in a one-to-one oxygen to argon gas mixture at $10^{-2}$ torr at room temperature will generally result in PdO beads in a platinum matrix.

Figure 10:
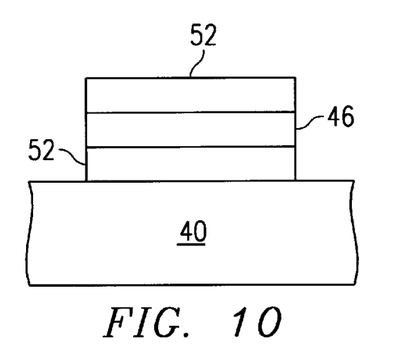
FIG. 10 is a cross section of a planar capacitor structure wherein the capacitor electrodes are alloys containing an oxygen source component.

In a fourth preferred embodiment, the oxygen source material is a component of an alloy which is used as an electrode to the dielectric material. FIG. 10 shows a capacitor structure in which both electrodes are alloys. Alternately, only one electrode may be an alloy containing an oxygen source. Preferably in that case, the upper electrode is the alloy.

Figure 11:
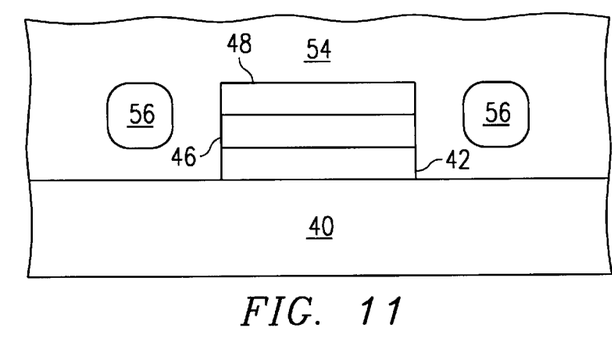
FIG. 11 is a cross section of a planar capacitor wherein volumes of oxygen source material are disposed near the capacitor in a surrounding passivation layer.

In a fifth preferred embodiment, oxygen source material is placed nearby to the dielectric yet does not form part of an electrical conduction path. These oxygen sources are therefore not required to be electrically conductive. FIG. 11 shows a planar capacitor structure (lower electrode 42, dielectric 46, and upper electrode 48) which is enclosed within a passivation layer 54 (typically $SiO_2$). The passivation layer contains volumes of oxygen source material which are near but not in contact with the dielectric. In general, the regions of oxygen source material should be as close as possible to the oxygen containing dielectric 46. These volumes supply sacrificial oxygen to any reducing species present, preventing reduction of the oxygen containing dielectric. Formation of the volumes of oxygen source material may be accomplished by any well known methods. For example, the passivation layer may be deposited, etched to form holes, then the holes filled with oxygen source material. Alternately, the passivation layer may be deposited in several layers, with openings created in which the oxygen source material is deposited.

Figure 12:
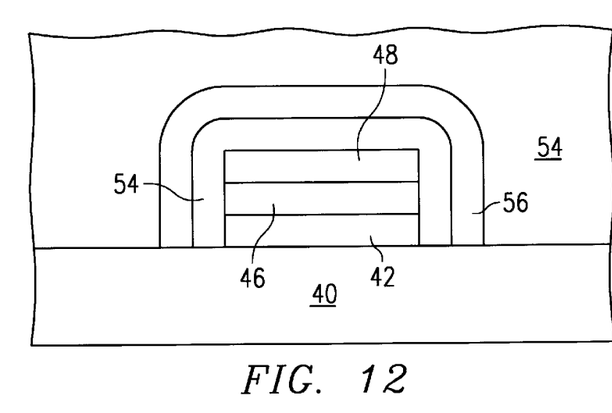
FIG. 12 is a cross section of a planar capacitor wherein the capacitor structure is partially encapsulated in a layer of oxygen source material.

In a sixth preferred embodiment, illustrated in FIG. 12, the integrated circuit capacitor (lower electrode 42, dielectric 46, and upper electrode 48) is wholly or partially encapsulated within a layer of oxygen source material 56. Similarly to the structure of FIG. 11, the oxygen source layer 56 may be formed by any technique well known in the art.

Figure 13:
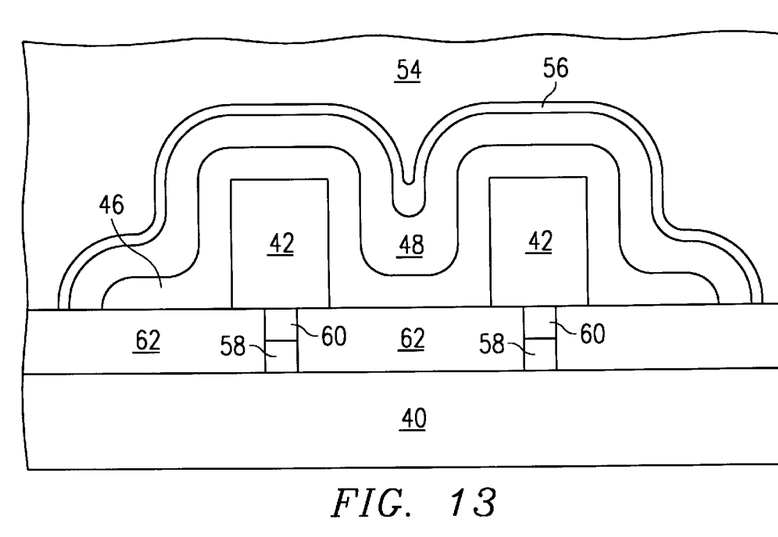
FIG. 13 is a cross section of two capacitor structures which share a common upper electrode which has been oxidized to provide a sacrificial oxygen source.

In the seventh preferred embodiment, illustrated in FIG. 13, an example of two capacitors in a high density DRAM (i.e. 256 megabit or 1 gigabit) structure is given. The lower electrodes 42 have a high aspect ratio, giving an increased surface area to the dielectric which deposited thereon using a conformal deposition technique. Lower electrodes 42 rest on an insulating spacer layer 62, which is preferably $SiO_2$. Electrical contact to the substrate 40 is provided by plugs composed of polysilicon 58 and TiN 60. A layer of $TiSi_2$ may be interposed between 58 and 60. The dielectric layer 46 is preferably barium strontium titanate (BST). The upper electrode layer 48 is common to both capacitors and is preferably platinum. The oxygen source material 56 is preferably $PtO_2$ and is formed by plasma ashing of the surface of 48 at approximately 200° C. Layer 56 thereby forms an excellent sacrificial source of oxygen to prevent reduction of the BST while requiring only one additional processing step. Passivation layer 54 is preferably $SiO_2$.

For all preferred embodiments, layers or volumes of oxygen source materials may be formed by any well known deposition techniques. Thin film deposition techniques may be used, such as: reactive sputter deposition; sputter deposition from an oxygen containing target; metal organic chemical vapor deposition and/or chemical vapor deposition with or without plasma enhancement; sol-gel deposition; and metal organic decomposition.

Formation of oxygen source materials by oxidation of a metal or metal alloy, as discussed above, may be accomplished by any well known technique, such as: elevated temperature plasma ashing; and UV enhanced oxidation using $O_2$, $N_2O$ or $O_3$, possibly at elevated temperatures.

The term 'oxygen source material' as used herein means a material with oxygen partial pressure $P_R(O_2)$ which is greater than the partial pressure at which the oxygen-containing dielectric is reduced, referred to herein as the critical partial pressure $P_C(O_2)$.

For all preferred embodiments, the necessary placement of the oxygen source materials with respect to the oxygen-containing dielectric material is governed by the requirement that the oxygen partial pressure during subsequent processing steps (steps subsequent to the formation of the sacrificial oxygen sources) remain above $P_C(O_2)$ for the entire volume of oxygen-containing dielectric material. This in generally will be easily achieved in those structures wherein the oxygen source material is a part of the capacitor electrodes and thereby essentially in contact with the dielectric material. Well-known techniques for calculating the oxygen partial pressure throughout the integrated circuit may be utilized in designing structures wherein the volumes of oxygen source material are not in contact with the oxygen-containing dielectric material (as in FIG. 11, for example).

The sole Table, below, provides an overview of some embodiments and the figures.

TABLE

| Figure Element | Generic Term | Preferred or Specific Term | Function/Alternate Terms |
|---|---|---|---|
| 36 | Conductor | Polysilicon | Provides electrical connections to other areas of integrated circuit; Aluminum |
| 37 | Conductive plug | Aluminum | |
| 38 | Protective layer | $SiO_2$ | |
| 39 | Insulating layer | $SiO_2$ | |
| 40 | Substrate | Silicon | Underlying integrated circuit; Partially complete DRAM cell; Ge, GaAs |
| 42 | Lower Electrode | Tungsten | Provides electrical contact between substrate and oxide material. TiN, Poly Silicon, Al |
| 43 | Sticking Layer | | Increases adhesion between lower electrode and substrate. |
| 44 | Electrically Conductive Oxygen Source | $RuO_2$; Pt + PdO alloy | Electrically conductive materials with $P_R(O_2) > P_c(O_2)$. Conductive Metal Oxides. Oxygen Source Material. |
| 46 | Oxygen-containing dielectric material | Barium Strontium Titanate | Reduced at oxygen partial pressure $P_c$. Materials containing oxygen, including dielectric, ferroelectric, pyroelectric and superconducting materials. Perovskites; High Dielectric Materials; Barium Titanate; Metal Oxides; Lead Zirconate Titanate (PZT). |
| 48 | Upper Electrode | Tungsten | Provides electrical contact to upper surface of Dielectric. TiN, Poly Silicon, Aluminum |

TABLE-continued

| Figure Element | Generic Term | Preferred or Specific Term | Function/Alternate Terms |
|---|---|---|---|
| 50 | Electrode containing oxygen source material | Pt + Pd annealed in oxygen | Pt + Ru; Au + Ag |
| 52 | Conductor/ Oxygen source alloy | $RuO_2$ + PdO | Oxygen Source Material. Pt + $PtO_2$; Pt + PdO; Pt + $RuO_2$; Pt + $AgO_2$; Pd + PdO; Pd + $AgO_2$; Ru + $RuO_2$. Alloys of nobel metals such as those above with or without Rh, Au, Re, Os, and Ir. |
| 54 | Passivation Layer | $SiO_2$ | Insulating Passivation layer. Nitrides; Boron phosphate silicate glass (BPSG); phosphate silicate glass; |
| 56 | Oxygen Source Material | PdO | Has oxygen partial pressure $P_R(O_2) > P_c(O_2)$. Not necessarily conductive. PtO; $PtO_2$; $RuO_2$; $AgO_2$; AgO |

A few preferred embodiments have been described in detail hereinabove. It is to be understood that the scope of the invention also comprehends embodiments different from those described, yet within the scope of the claims.

Internal and external connections to the structures presented can be ohmic, capacitive, direct or indirect, via intervening circuits or otherwise. Implementation is contemplated in discrete components or fully integrated circuits in silicon, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A structure in an integrated circuit, said structure comprising
   a substrate;
   a lower electrode comprised of electrically conductive oxygen source material on said substrate;
   a layer of oxygen-containing dielectric material on said lower electrode; and
   an upper electrode in contact with said layer.

2. The structure in an integrated circuit, said structure of claim 1, wherein said upper electrode is comprised of electrically conductive oxygen source material.

3. A structure comprising
   a substrate;
   a lower electrode on said substrate;
   a first layer of conductive oxygen source material on said lower electrode;
   a layer of oxygen-containing dielectric material on said first layer; and
   an upper electrode on said layer of oxygen-containing dielectric material.

4. The structure of claim 3, wherein said upper electrode is comprised of a second layer of conductive oxygen source material on said layer of dielectric material.

5. The structure of claim 4, wherein said upper electrode is further comprised of a layer of conductive material on said second layer of conductive oxygen source material.

6. A structure in an integrated circuit, said structure comprising
   a substrate;
   an electrode containing an oxygen source material on said substrate;
   a layer of oxygen-containing dielectric material on said electrode; and
   an upper electrode on said layer.

7. The structure of claim 6, wherein said upper electrode is comprised of a layer of conductive material containing oxygen source material.

8. The structure of claim 6, wherein said oxygen source material is electrically conductive.

9. The structure of claim 6, wherein said oxygen source material is PdO.

10. A structure in an integrated circuit, said structure comprising
    a substrate;
    a lower electrode comprised of an alloy of a conductive material and an oxygen source material on said substrate;
    a layer of oxygen-containing dielectric material on said lower electrode; and
    an upper electrode on said layer of dielectric material.

11. The structure of claim 10, wherein said upper electrode is comprised of an alloy of a conductive material and an oxygen source material.

12. A structure in an integrated circuit, said structure comprising
    a substrate;
    a lower electrode on said substrate;
    a layer of oxygen-containing dielectric material on said lower electrode;
    an electrode on said layer; and
    a layer of oxygen source material on said electrode.

13. The structure of claim 12, wherein said lower electrode is Pt, said oxygen-containing dielectric is barium strontium titanate, said electrode is Pt, and said oxygen source material is PtO.

14. An integrated circuit capacitor comprising
    a substrate;
    a capacitor structure on said substrate and including a first electrode, a dielectric, and a second electrode; and
    one or more volumes of oxygen source material disposed nearby to said capacitor structure such that the partial pressure of oxygen at all points in said dielectric is sufficiently high to prevent reduction of said dielectric.

* * * * *